(12) United States Patent  (10) Patent No.: US 9,337,625 B2
Miyazawa  (45) Date of Patent: May 10, 2016

(54) SEMICONDUCTOR DEVICE FOR USE IN AN IGNITION SYSTEM OF AN INTERNAL COMBUSTION ENGINE

(71) Applicant: FUJI ELECTRIC CO., LTD., Kawasaki-shi (JP)

(72) Inventor: Shigemi Miyazawa, Matsumoto (JP)

(73) Assignee: FUJI ELECTRIC CO., LTD., Kawasaki-shi (JP)

(*) Notice: Subject to any disclaimer, the term of this patent is extended or adjusted under 35 U.S.C. 154(b) by 30 days.

(21) Appl. No.: 14/622,319

(22) Filed: Feb. 13, 2015

(65) Prior Publication Data

US 2015/0263491 A1    Sep. 17, 2015

(30) Foreign Application Priority Data

Mar. 14, 2014  (JP) ................. 2014-051997

(51) Int. Cl.
*F02P 3/055* (2006.01)
*H01T 15/00* (2006.01)
*H03K 17/042* (2006.01)
*H01T 1/15* (2006.01)
*F02P 3/04* (2006.01)

(52) U.S. Cl.
CPC ............. *H01T 15/00* (2013.01); *F02P 3/0435* (2013.01); *H01T 1/15* (2013.01); *H03K 17/04206* (2013.01); *F02P 3/0552* (2013.01)

(58) Field of Classification Search
USPC ............. 123/609, 644, 630, 605, 406.58, 123/406.59, 637, 620
See application file for complete search history.

(56) References Cited

U.S. PATENT DOCUMENTS

| 2002/0040709 A1* | 4/2002 | Kohno et al. ........... 123/605 |
| 2004/0200463 A1* | 10/2004 | Ando ................... 123/630 |
| 2005/0252496 A1* | 11/2005 | Ando et al. ........... 123/644 |
| 2009/0289670 A1 | 11/2009 | Toyoda et al. |

FOREIGN PATENT DOCUMENTS

| JP | 2003-324966 A | 11/2003 |
| JP | 2009-284420 A | 12/2009 |

* cited by examiner

*Primary Examiner* — Tuyet Vo
(74) *Attorney, Agent, or Firm* — Rabin & Berdo, P.C.

(57) ABSTRACT

A semiconductor device includes a power semiconductor element, a gate pull-down circuit which is connected to a gate terminal of the power semiconductor element, and a gate resistor which is connected between an input terminal of the semiconductor device and the gate terminal of the power semiconductor element. The gate pull-down circuit has a constant current circuit by which electric charges can be extracted from a gate capacitance of the power semiconductor element when a signal inputted to the input terminal has a low level. As a result, the semiconductor device has an improved switching speed and an improved noise resistance.

19 Claims, 10 Drawing Sheets

SEMICONDUCTOR DEVICE FOR USE IN AN IGNITION SYSTEM OF AN INTERNAL COMBUSTION ENGINE

CROSS-REFERENCE TO RELATED APPLICATION

This application claims the benefit of foreign priority of Japanese application 2014-051997, filed on Mar. 14, 2014, the disclosure of which is incorporated herein by reference.

BACKGROUND OF THE INVENTION

1. Field of the Invention

The present invention relates to a semiconductor device used for an ignition device for an internal combustion engine of a car. Particularly, it relates to a semiconductor device which includes a power semiconductor element serving as a switch and which is provided with a function of pulling down a gate of the power semiconductor element.

2. Description of the Background Art

Figure 7:
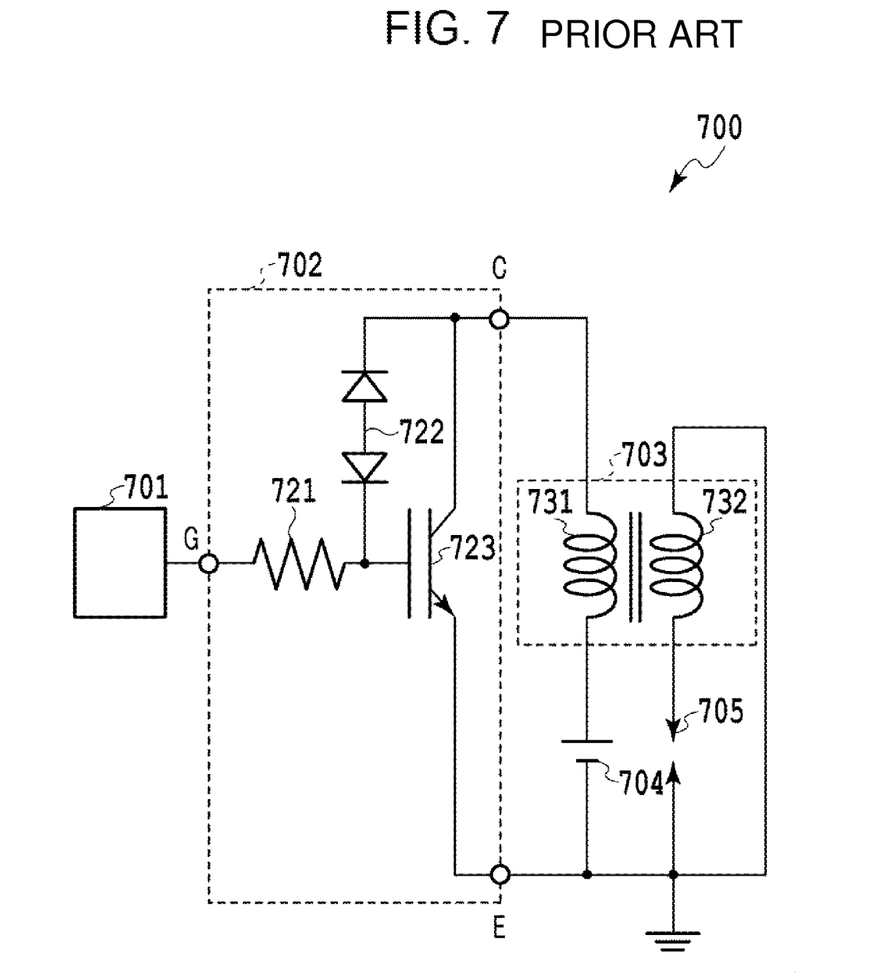
FIG. 7 is a view showing an example of a configuration of an ignition semiconductor device for an internal combustion engine according to the background art.

A semiconductor device including a power semiconductor element which controls switching of a primary-side current of an ignition coil is used for an ignition device for an internal combustion engine of a car. FIG. 7 shows an example of a configuration of an ignition semiconductor device for an internal combustion engine according to the background art, in which an IGBT (Insulated Gate Bipolar Transistor) is used as a power semiconductor element. An ignition semiconductor device 700 which includes an engine control unit (ECU) 701, an ignition semiconductor integrated circuit (IC) 702, an ignition coil 703, a voltage source 704, and a spark plug 705 is shown in FIG. 7.

The ignition IC 702 includes an IGBT 723 which controls ON/OFF of a primary current of the ignition coil 703, a gate resistor 721, a Zener diode 722 which clamps a collector voltage of the IGBT 723, a C terminal (collector electrode) which is connected to one end of the ignition coil 703, an E terminal (emitter electrode) which is connected to a ground potential, and a G terminal which serves as an input terminal connected to the ECU 701. Accordingly, the ignition IC 702 has three terminals, i.e. the C terminal, the E terminal and the G terminal, as its terminals.

Operation of the ignition semiconductor device 700 shown in FIG. 7 will be described here. The ECU 701 outputs a signal for controlling ON/OFF of the IGBT 723 of the ignition IC 702 to the G terminal. When, for example, 5 V is inputted to the G terminal from the ECU 701, the IGBT 723 turns ON. When 0 V is inputted to the G terminal, the IGBT 723 turns OFF.

Next, an operation waveform of the ignition semiconductor device 700 shown in FIG. 7 will be described with reference to FIGS. 3A to 3C. First, an ON signal VG of an H (high) level is inputted to the G terminal from the ECU 701 as shown in FIG. 3C, the IGBT 723 turns ON and a collector current $I_c$ begins to flow into the C terminal from the voltage source 704 (for example, 14 V) through a primary coil 731 of the ignition coil 703 (time instant t1). As to the collector current $I_c$, dI/dt is determined based on the inductance of the primary coil 731 and the voltage applied thereto. Next, when an OFF signal VG of an L (low) level is inputted to the G terminal from the ECU 701, the IGBT 723 turns OFF and the collector current $I_c$ decreases suddenly (time instant t2). Due to the sudden change of the collector current $I_c$, a voltage between opposite ends of the primary coil 731 increases suddenly. At the same time, a voltage between opposite ends of a secondary coil 732 of the ignition coil 703 also increases up to several tens kV (for example, 30 kV) and this voltage is applied to the spark plug 705. The spark plug 705 discharges electricity when the applied voltage is at least about 10 kV.

Further, operation for about 10 microseconds immediately after the time instant t2 will be described in detail. When a collector voltage $V_c$ of the IGBT 723 exceeds a withstand voltage $V_{zd}$ of the Zener diode 722, a current flows into the gate resistor 721 through the Zener diode 722. Thus, a gate voltage $VG_{out}$ and the collector voltage $V_c$ of the IGBT 723 can keep the relation $VG_{out} \approx V_{th}$, and the relation $V_c \approx V_{zd}$ unless energy release of the primary coil 731 is completed. When the energy release of the primary coil 731 is completed, the gate voltage $VG_{out}$ and the collector voltage $V_c$ of the IGBT 723 decrease until the gate voltage $VG_{out}$ is equal to 0 V and the collector voltage $V_c$ is equal to $V_B$. Here, the reference sign $V_{th}$ designates a threshold voltage of the IGBT 723 and the reference sign $V_B$ designates a power supply voltage. The aforementioned relation $VG_{out} \approx V_{th}$ is a condition on which the IGBT 723 cannot be turned ON fully to make the collector voltage $V_c$ substantially equal to 0 V but the IGBT 723 can be turned ON slightly enough to prevent the collector voltage $V_c$ from reaching the withstand voltage $V_{zd}$ or higher.

SUMMARY OF THE INVENTION

The aforementioned ignition device for an internal combustion engine according to the background art has the following problem.

In the ignition device, the output voltage of the coil increases with the increase of switching speed at a turn-OFF time, so that loss and heat generation during switching can be reduced. It is therefore desirable to increase the switching speed at the turn-OFF time. The switching speed at the turn-OFF time increases with the increase of a current value with which electric charges are released from a gate capacitance of the IGBT 723. Accordingly, reduction of a resistance value $R_g$ of the gate resistor 721 leads to an increase of the switching speed.

On the other hand, in the ignition semiconductor device 700 shown in FIG. 7, the gate resistor 721 and the gate capacitance of the IGBT 723 form a low-pass filter, which is designed to prevent malfunction when noise having a pulse width in the order of several microseconds is inputted to the G terminal. As the resistance value $R_g$ is increased, for example, to be as large as 500Ω, resistance against the pulse width of the noise is increased. Incidentally, it is assumed that the noise is derived from another component than the ignition IC 702, which component is on the same print board mounted with the ignition IC 702.

In addition, the collector voltage $V_c$ and the gate voltage $VG_{out}$ oscillate to generate noise immediately after the collector voltage $V_c$ of the IGBT 723 exceeds the withstand voltage $V_{zd}$ (this state will be referred to as collector clamp) until those voltages are stabilized in the state of $VG_{out} \approx V_{th}$ and $V_c \approx V_{zd}$. Due to a negative feedback circuit constituted by the Zener diode 722 and the gate resistor 721, the noise can be decreased when the resistance value $R_g$ of the gate resistor is increased.

As described above, when the resistance value $R_g$ (for example, 150Ω) is decreased, there is indeed an advantage that the switching speed can be increased, but there is a problem that noise during the collector clamp increases or resistance against noise malfunction decreases.

On the other hand, Patent Literatures 1 and 2 disclose a method for increasing the speed of OFF operation of an IGBT. According to the method, a transistor which connects a gate terminal of the IGBT to an emitter terminal of the same is provided so that the transistor can be turned ON to make short-circuit between the gate terminal and the emitter terminal of the IGBT when an OFF signal of 0 V is inputted to the G terminal.

Assume that the configuration having the Zener diode as a clamp element as shown in FIG. 7 is applied to the configuration described in any of Patent Literatures 1 and 2. In this case, however, there is a problem that, when the collector voltage of the IGBT reaches the Zener voltage of the Zener diode while the transistor connecting the gate terminal of the IGBT directly to the emitter terminal is ON, a large current flows into the Zener diode and the transistor to damage them. In the worst case, those elements may be broken down.

Even if the Zener diode is not connected, when the transistor turns ON to turn OFF the IGBT and suddenly increase the collector voltage of the IGBT, a large current may flow between the collector and the gate of the IGBT through a parasitic element such as a parasitic capacitance. Therefore, there is a fear that the transistor may be broken down if things come to the worst.

Further, even if the breakdown problem can be solved, the gate resistor which is set at a resistance value of zero brings about the worst condition to the aforementioned noise generated during the collector clamp.

In order to solve the aforementioned problem, an object of the invention is to provide a semiconductor device capable of making improvement of switching speed at a turn-OFF time and improvement of noise resistance compatible with each other.

In order to solve the problem, a semiconductor device according to a first aspect of the invention includes: a gate pull-down circuit which is connected to a gate terminal of a power semiconductor element; and a gate resistor which is connected between an input terminal of the semiconductor device and the gate terminal of the power semiconductor element. In the semiconductor device according to the first aspect of the invention, the gate pull-down circuit has a constant current circuit by which electric charges can be extracted from a gate capacitance of the power semiconductor element when a signal inputted to the input terminal is a low level.

A semiconductor device according to a second aspect of the invention is the semiconductor device according to the first aspect, further including: a Zener diode which is connected between the gate terminal of the power semiconductor element and a collector terminal of the semiconductor device.

A semiconductor device according to a third aspect of the invention is the semiconductor device according to the first or second aspect, wherein: the gate pull-down circuit includes: a depletion type MOS transistor which has one end connected a collector terminal of the semiconductor device; a first MOS transistor which has one end connected to the other end of the depletion type MOS transistor, and the other end connected to an emitter terminal of the semiconductor device; a second MOS transistor which has a gate terminal connected in common to a gate terminal of the depletion type MOS transistor, a gate terminal of the first MOS transistor, the other end of the depletion type MOS transistor and the one end of the first MOS transistor, one end connected to the gate terminal of the power semiconductor element, and the other end connected to an emitter terminal of the semiconductor device or the input terminal; a threshold circuit which is connected between the input terminal and the emitter terminal of the semiconductor device; and a third MOS transistor which has a gate terminal connected to an output terminal of the threshold circuit, one end connected to the gate terminal of the second MOS transistor, and the other end connected to the emitter terminal of the semiconductor device.

A semiconductor device according to a fourth aspect of the invention is the semiconductor device according to the third aspect, wherein: the threshold circuit outputs the same voltage as the signal inputted to the input terminal when the signal inputted to the input terminal is larger than a threshold, and the threshold circuit outputs 0 V when the signal inputted to the input terminal is smaller than the threshold.

A semiconductor device according to a fifth aspect of the invention is the semiconductor device according to the third or fourth aspect, wherein: the threshold circuit includes: a voltage dividing circuit which is connected between the input terminal and the emitter terminal of the semiconductor device; a second depletion type MOS transistor and a fourth MOS transistor which are connected in series between the input terminal and the emitter terminal of the semiconductor device; and a third depletion type MOS transistor and a fifth MOS transistor which are connected in series between the input terminal and the emitter terminal of the semiconductor device; an output of the voltage dividing circuit is connected to a gate terminal of the fourth MOS transistor; a gate terminal of the fifth MOS transistor is connected to a gate terminal and a source terminal of the second depletion type MOS transistor and a drain terminal of the fourth MOS transistor; and a gate terminal of the third depletion type MOS transistor is connected to a source terminal of the third depletion type MOS transistor, a drain terminal of the fifth MOS transistor and the output terminal of the threshold circuit.

A semiconductor device according to a sixth aspect of the invention is the semiconductor device according to the first or second aspect, wherein: the gate pull-down circuit includes: a depletion type MOS transistor which has one end connected to a collector terminal of the semiconductor device; a first MOS transistor which has one end connected to the other end of the depletion type MOS transistor, and the other end connected to an emitter terminal of the semiconductor device; and a second MOS transistor which has a gate terminal connected in common to a gate terminal of the depletion type MOS transistor, a gate terminal of the first MOS transistor, the other end of the depletion type MOS transistor and the one end of the first MOS transistor, one end connected to the input terminal, and the other end connected to the gate terminal of the power semiconductor element.

A semiconductor device according to a seventh aspect of the invention is the semiconductor device according to the first or second aspect, wherein: the gate pull-down circuit includes: a depletion type MOS transistor which has one end connected to a collector terminal of the semiconductor device; a first MOS transistor which has one end connected to the other end of the depletion type MOS transistor and the other end connected to an emitter terminal of the semiconductor device; and a second MOS transistor which has a gate terminal connected in common to a gate terminal of the depletion type MOS transistor, a gate terminal of the first MOS transistor, the other end of the depletion type MOS transistor and the one end of the first MOS transistor, one end connected to an emitter terminal of the semiconductor device, and the other end connected to the gate terminal of the power semiconductor element.

According to the semiconductor device according to the invention, it is possible to make the switching speed higher than that in the background art while securing noise resistance.

DETAILED DESCRIPTION OF THE INVENTION

Embodiments of semiconductor devices according to the invention will be described below.

Embodiment 1

Figure 1:
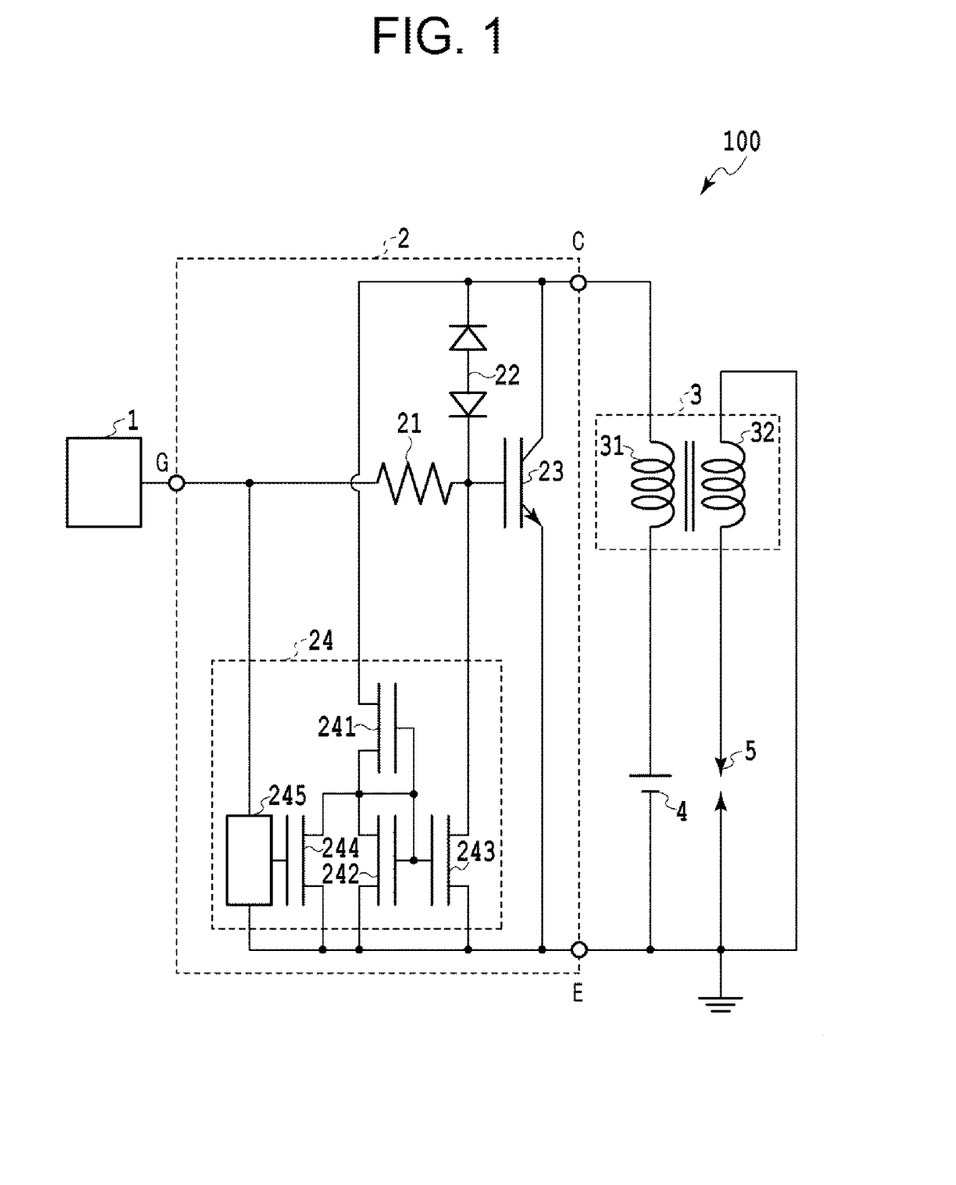
FIG. 1 is a view showing a configuration of a semiconductor device according to Embodiment 1 of the invention.

FIG. 1 shows a configuration of a semiconductor device according to Embodiment 1 of the invention. A semiconductor device 100 including an ECU 1, an ignition IC 2, an ignition coil 3 including a primary coil 31 and a secondary coil 32, a voltage source 4, and a spark plug 5 is shown in FIG. 1. The semiconductor device 100 according to Embodiment 1 is an example of an ignition semiconductor device which is provided with a function of pulling down a gate of a power semiconductor element. In the following description, an MOSFET (Metal-Oxide-Semiconductor Field-Effect Transistor) is expressed as an MOS transistor.

The ignition IC 2 is provided with an n-channel type IGBT 23, a gate resistor 21, a Zener diode 22, and a gate pull-down circuit 24. The n-channel type IGBT 23 controls ON/OFF of a primary current of the ignition coil 3. The gate resistor 21 is connected between the ECU 1 and the IGBT 23. The Zener diode 22 clamps a collector voltage of the IGBT 23. The gate pull-down circuit 24 pulls down a gate of the IGBT 23. The ignition IC 2 has three terminals, i.e. a C terminal (collector electrode) connected to one end of the primary coil 31 of the ignition coil 3, an E terminal (emitter electrode) connected to a ground potential and a G terminal serving as an input terminal connected to the ECU 1. The Zener diode 22 is connected to the C terminal at one end and connected to the gate terminal of the IGBT 23 at the other end.

The ECU 1 is connected to the gate terminal of the IGBT 23 through the G terminal and the gate resistor 21 of the ignition IC 2. The primary coil 31 of the ignition coil 3 is connected to the C terminal of the ignition IC 2 at the one end and connected to one end of the voltage source 4 at the other end. The secondary coil 32 of the ignition coil 3 is connected to the ground potential at one end and connected to one end of the spark plug 5 at the other end. The other end of the voltage source 4 and the other end of the spark plug 5 are connected to the ground potential.

The gate pull-down circuit 24 includes a threshold circuit 245 which is driven by a voltage between the G terminal and the E terminal, an n-channel depletion type (Dep) MOS transistor 241, and n-channel MOS transistors 242, 243 and 244. The threshold circuit 245 is connected between the G terminal and the E terminal. An OUT terminal of the threshold circuit 245 is connected to a gate terminal of the MOS transistor 244. A drain terminal of the Dep MOS transistor 241 is connected to the C terminal. Source terminals of the MOS transistors 242, 243 and 244 are connected to the E terminal. A drain terminal of the MOS transistor 243 is connected to the gate terminal of the IGBT 23. Drain terminals of the MOS transistors 242 and 244 and a source terminal of the Dep MOS transistor 241 are connected in common to gate terminals of the Dep MOS transistor 241 and the MOS transistors 242 and 243.

Figure 2:
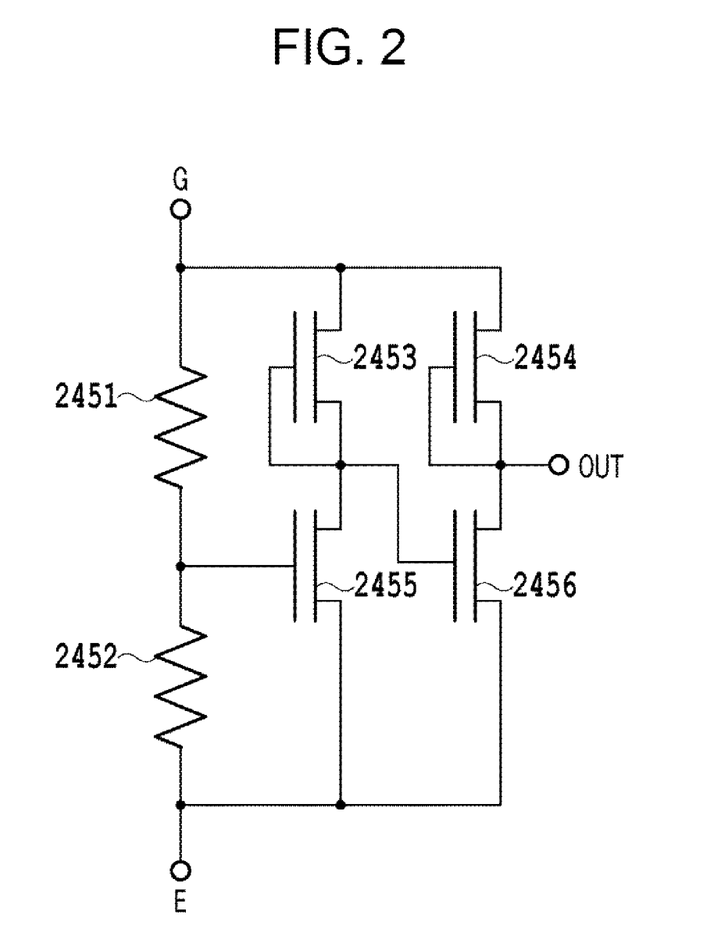
FIG. 2 is a view showing an example of a circuit diagram of a threshold circuit 245.

FIG. 2 shows an example of a circuit diagram of the threshold circuit 245. As shown in FIG. 2, the threshold circuit 245 includes a voltage dividing circuit consisting of resistors 2451 and 2452, n-channel Dep MOS transistors 2453 and 2454, and n-channel MOS transistors 2455 and 2456. The threshold circuit 245 divides the voltage of the G terminal by the voltage dividing circuit consisting of the resistors 2451 and 2452 and inputs the divided voltage to a gate terminal of the MOS transistor 2455.

A drain terminal of the MOS transistor 2455 is connected in common to a source terminal and a gate terminal of the Dep MOS transistor 2453 and a gate terminal of the MOS transistor 2456. A source terminal of the MOS transistor 2455 and a source terminal of the MOS transistor 2456 are connected to the E terminal. A drain terminal of the MOS transistor 2456 is connected to a source terminal of the Dep MOS transistor 2454 and connected to the OUT terminal which is an output terminal of the threshold circuit 245. A drain terminal of the Dep MOS transistor 2453 and a drain terminal of the Dep MOS transistor 2454 are connected to the G terminal.

When the voltage of the G terminal is higher than a predetermined voltage (for example, 2 V), that is, when the output voltage of the voltage dividing circuit is higher than a threshold voltage of the MOS transistor 2455, the MOS transistor 2455 turns ON so that 0 V can be applied to the gate of the MOS transistor 2456. As a result, the MOS transistor 2456 turns OFF so that the OUT terminal can be brought into the same voltage as the G terminal through the Dep MOS transistor 2454. In addition, when the output voltage of the voltage dividing circuit is lower than the threshold voltage of the MOS transistor 2455, the MOS transistor 2455 turns OFF so that the voltage of the G terminal can be applied to the gate of the MOS transistor 2456 through the Dep MOS transistor 2453. As a result, the MOS transistor 2456 turns ON so that the voltage of the OUT terminal can become 0 V.

Next, an operation waveform of the semiconductor device 100 shown in FIG. 1 will be described with reference to FIGS. 3A to 3C. First, when an ON signal of an H level voltage VG (for example, 5 V) is inputted to the G terminal from the ECU 1 at a time instant t1 as shown in FIG. 3C, the output voltage $V_{out}$ of the threshold circuit 245 of the ignition IC 2 becomes 5 V to turn ON the MOS transistor 244 while the MOS transistor 244 pulls down the gate of the MOS transistor 243 to turn OFF the MOSS transistor 243 and release the gate of IGBT 23 from pull-down performed by the MOS transistor 243. In addition, the IGBT 23 turns ON and a collector current $I_c$ begins to flow into the C terminal through the primary coil 31 of the ignition coil 3 from the voltage source 4 as shown in FIG. 3A. As to the collector current $I_c$, dI/dt is determined based on the inductance of the primary coil 31 and the voltage applied thereto.

Figure 3A:
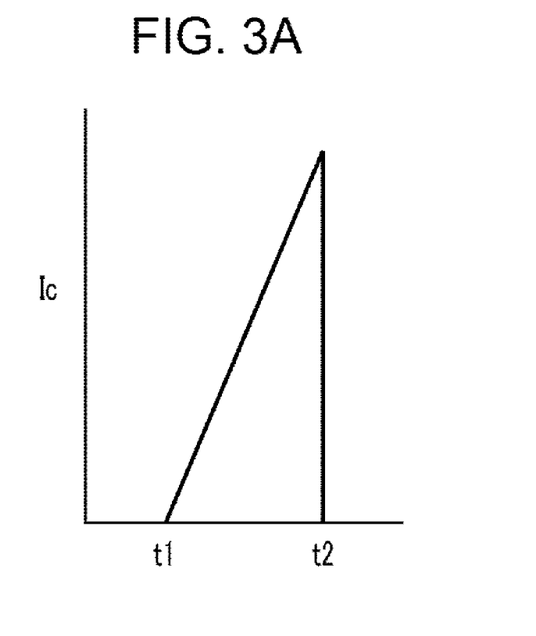
FIGS. 3A to 3C are graphs showing an operation waveform of the semiconductor device.
Figure 3B:
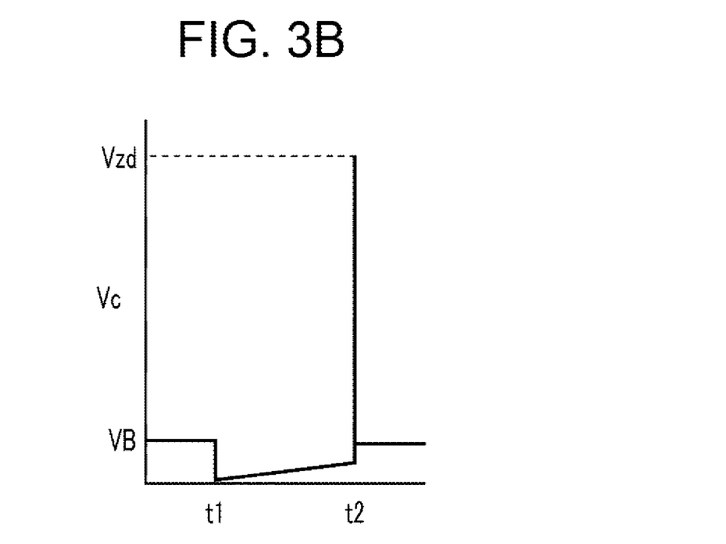
Figure 3C:
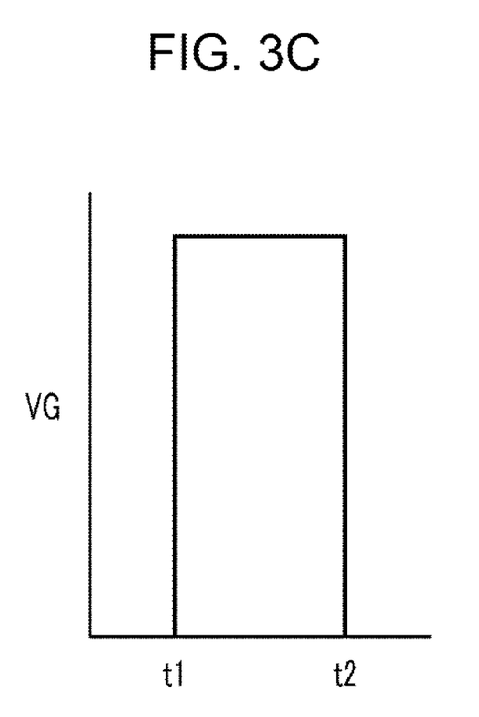

Next, when an OFF signal of an L level (for example, 0 V) is inputted to the G terminal from the ECU 1 at a time instant t2 as shown in FIG. 3C, the IGBT 23 turns OFF to decrease the collector current $I_c$ suddenly as shown in FIG. 3A.

Here, the operation waveform of the semiconductor device 100 shown in FIG. 1 on an enlarged time axis before and after the time instant t2 will be described with reference to FIGS. 4A to 4D. The abscissa in FIGS. 3A to 3C is in the order of several milliseconds whereas the operation waveform before and after the time instant t2 in the abscissa which is in the order of several microseconds is shown in FIGS. 4A to 4D.

Figure 4A:
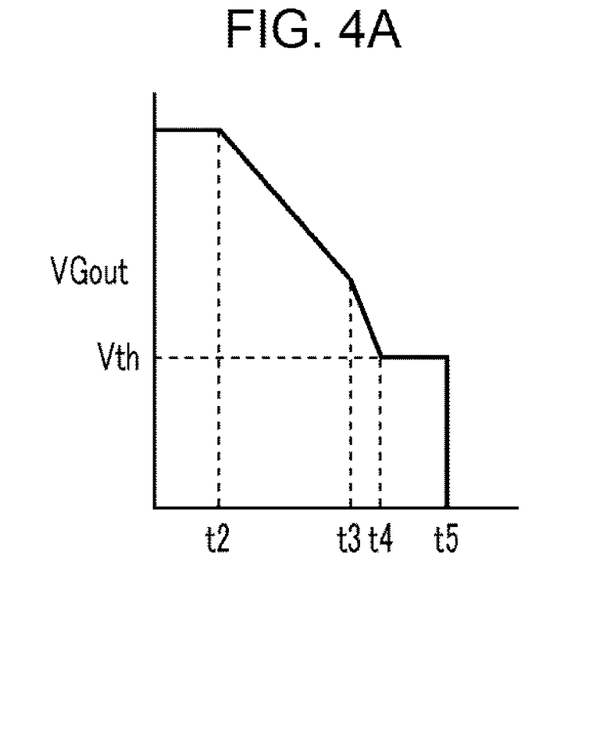
FIGS. 4A to 4D are enlarged views of the operation waveform in the semiconductor device 100 before and after a time instant t2 shown in FIGS. 3A to 3C.
Figure 4B:
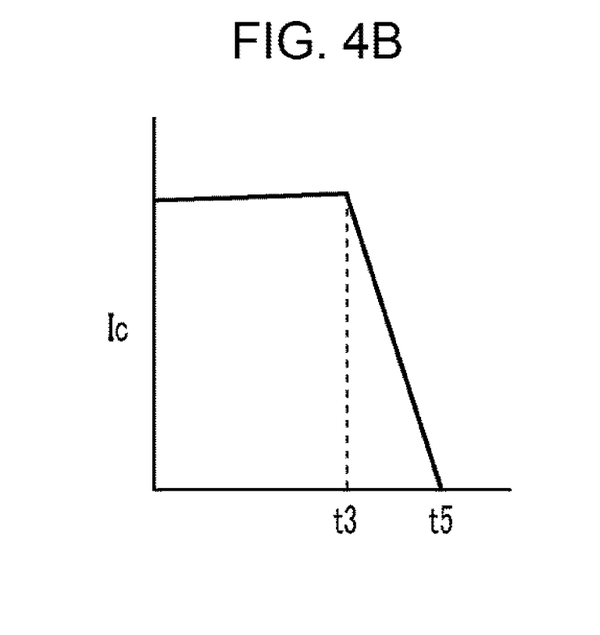

When the OFF signal of the L level (for example, 0 V) is inputted to the G terminal from the ECU 1 at the time instant t2, electric charges are released from a gate capacitance of the IGBT 23 through the gate resistor 21. As shown in FIG. 4A and FIG. 4B, when the gate voltage $VG_{out}$ approaches the threshold voltage $V_{th}$ of the IGBT 23 at a time instant t3 after a lapse of a constant delay time (for example, 5 microseconds) between the time instant t2 and the time instant t3, the collector current $I_c$ decreases suddenly. A current $IG_{out}$ flowing from the gate capacitance of the IGBT 23 and a resistance value $R_g$ of the gate resistor 21 have a relation represented by the following (Expression 1), in which the reference sign $VG_{out}$ designates the gate voltage of the IGBT 23.

$$IG_{out}=VG_{out}/R_g \qquad \text{(Expression 1)}$$

A period of time (t3–t2) between the time instant t2 and the time instant t3 is determined based on the H level voltage VG, the threshold voltage $V_{th}$ of the IGBT 23 and the current $IG_{out}$ or the resistance value $R_g$. That is, as the current $IG_{out}$ is smaller or as the resistance value $R_g$ is larger, the period of time (t3–t2) is longer. Even when the IGBT 23 is about to be turned OFF by a malfunction caused by noise, the IGBT 23 can be resumed normally before being turned OFF as long as the noise disappears in the period of time (t3–t2). Accordingly, a final malfunction can be avoided. Thus, as the period of time (t3–t2) is longer, that is, as the resistance value $R_g$ is larger, the noise resistance is larger.

Figure 4C:
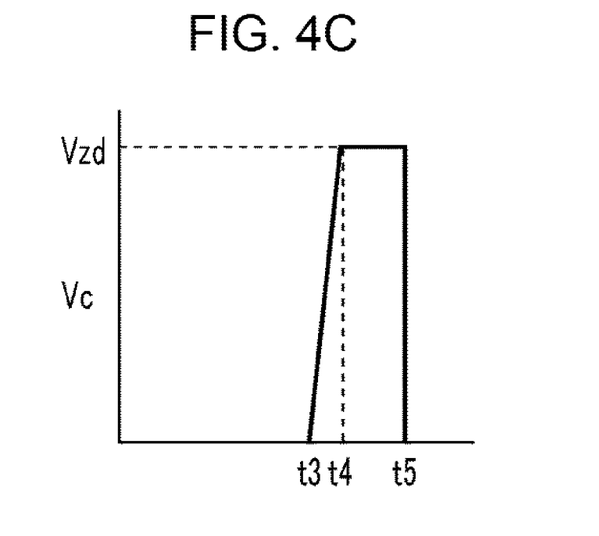

When the collector current $I_c$ then begins to decrease, the voltage between the opposite ends of the primary coil 31 increases suddenly. In addition, when the voltage VG of the G terminal is equal to 0 V, the voltage $V_{out}$ of the threshold circuit 245 of the ignition IC 2 becomes 0 V. Accordingly, the MOS transistor 244 turns OFF so that the gate terminals of the MOS transistors 242 and 243 can be released from pull-down. Therefore, the MOS transistor 242 turns ON through the Dep MOS transistor 241 in accordance with the increase of the collector voltage $V_c$ of the IGBT 23 on and after the time instant t3 as shown in FIG. 4C. The current flowing into the MOS transistor 242 increases until the current becomes equivalent to a saturation current of the Dep MOS transistor 241. Since the MOS transistors 242 and 243 form a current mirror, a constant current $Id_{sat}$ in a saturation region of the MOS transistor 243 is proportional to a ratio between gate widths of the MOS transistors 242 and 243 and the current flowing into the MOS transistor 242. Accordingly, a gate width of the Dep MOS transistor 241 can be adjusted to adjust the value of the saturation current flowing into the MOS transistor 242 while the ratio between the gate widths of the MOS transistors 242 and 243 can be adjusted to adjust the constant current $Id_{sat}$ in the saturation region of the MOS transistor 243 with respect to the saturation current. Thus, when, for example, the gate width of the Dep MOS transistor 241 is increased and the gate width of the MOS transistor 242 is increased relatively to the gate width of the MOS transistor 243, the constant current $Id_{sat}$ in the saturation region of the MOS transistor 243 can be limited.

Thus, the gate pull-down circuit 24 has a constant current circuit including the Dep MOS transistor 241 and the MOS transistors 242 and 243. Electric charges can be extracted from the gate capacitance of the IGBT 23 by the constant current circuit when the voltage VG is equal to 0 V. Moreover, the gate widths of the Dep MOS transistor 241 and the MOS transistors 242 and 243 etc. can be adjusted to adjust a value of the constant current in the constant current circuit.

Figure 4D:
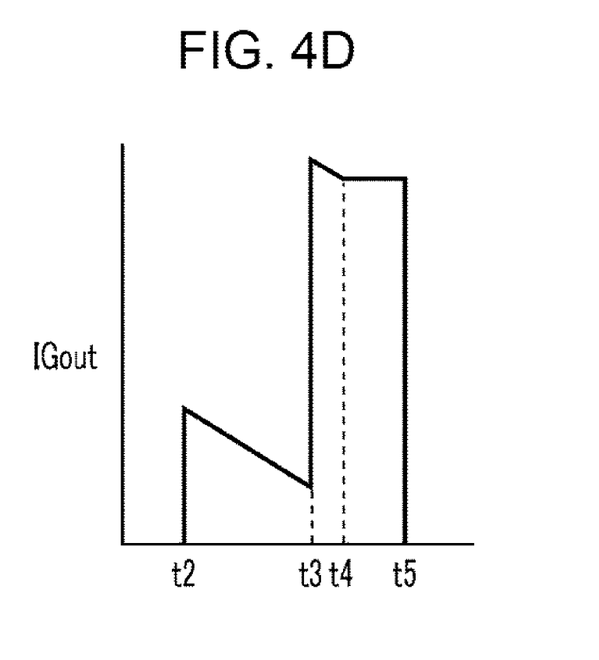

When the MOS transistor 243 turns ON, the current $IG_{out}$ increases by a current Id flowing between the drain and the source of the MOS transistor 243, as shown in FIG. 4D. Accordingly, the decrease of the gate voltage $VG_{out}$ and the increase of the collector voltage $V_c$ are accelerated as shown in FIG. 4A and FIG. 4C. Then, as shown in FIG. 4C, the collector voltage $V_c$ increases until reaching the withstand voltage $V_{zd}$ of the Zener diode 22 at a time instant t4. During a period of time (t4–t3), the current $IG_{out}$ and the resistance value $R_g$ have a relation represented by the following (Expression 2).

$$IG_{out}=VG_{out}/R_g+Id \qquad \text{(Expression 2)}$$

The current Id becomes equal to the saturation current $Id_{sat}$ when a pinch-off voltage Vp of the MOS transistor 243 and the gate voltage $VG_{out}$ satisfy a condition represented by the following (Expression 3).

$$VG_{out} \geq Vp \qquad \text{(Expression 3)}$$

Here, (Expression 3) is a condition on which the MOS transistor 243 operates in the saturation region and the current flowing into the MOS transistor 243 becomes constant regardless of the gate voltage $VG_{out}$. On this occasion, (Expression 2) has a relation represented by the following (Expression 4).

$$IG_{out}=VG_{out}/R_g+Id_{sat} \qquad \text{(Expression 4)}$$

Next, when the collector voltage $V_c$ reaches the withstand voltage $V_{zd}$ at the time instant t4, a current $I_{zd}$ flows into the gate of the IGBT 23 from the collector of the IGBT 23 through the Zener diode 22. In this case, in a period of time (t5–t4) in which the gate voltage $VG_{out}$ becomes constant based on the relation $VG_{out} \approx V_{th}$, the current $IG_{out}$ and the current $I_{zd}$ have a relation represented by the following (Expression 5).

$$IG_{out}=I_{zd} \qquad \text{(Expression 5)}$$

The following (Expression 6) can be derived from a combined resistance $RG_{out}$ of the resistance value $R_g$ and the MOS transistor 243 connected in series and (Expression 5).

$$VG_{out}=I_{zd} \times RG_{out} \qquad \text{(Expression 6)}$$

As described above, noise during the collector clamp decreases with the increase of the combined resistance $RG_{out}$ when the gate voltage $VG_{out}$ satisfies the following (Expression 7) with respect to the threshold voltage $V_{th}$ of the IGBT 23.

$$VG_{out}>V_{th} \qquad \text{(Expression 7)}$$

A part of the combined resistance $RG_{out}$ contributed by the MOS transistor 243 is a differential resistance of the MOS transistor 243 (the "reciprocal" of a value obtained by differentiating the current flowing into the MOS transistor 243 by the voltage $VG_{out}$ between the source and the drain of the MOS transistor 243). Accordingly, in the case of (Expression 3), the differential resistance is infinite. Therefore, the MOS transistor 243 has no contribution to the combined resistance $RG_{out}$, but the combined resistance $RG_{out}$ takes a maximum value $R_g$. Therefore, when the MOS transistor 243 is in the saturation region, the relation $RG_{out}=R_g$ is established. Accordingly, it is possible to satisfy (Expression 3) and (Expression 7) for measures against noise while establishing the relation $RG_{out}=R_g$ as long as the following (Expression 8) is satisfied.

$$Vp \leq V_{th} \qquad \text{(Expression 8)}$$

As described above, when the collector current $I_c$ begins to decrease to thereby lead to the sudden increase of the voltage between the opposite ends of the primary coil 31, the voltage between the opposite ends of the secondary coil 32 of the ignition coil 3 also increases simultaneously. The voltage is applied to the spark plug 5, and the spark plug 5 discharges electricity.

Here, noise malfunction resistance, switching speed and an noise output during the collector clamp in the semiconductor device according to the invention on the assumption that $V_{th}=2$ V, $VG_{out}=3$ V at the time instant t3, Vp=2 V, $R_g=500\Omega$ and $Id_{sat}=16$ mA have been converted into a resistance value $R_{g7}$ of the gate resistor 721 in the background-art semiconductor device shown in FIG. 7. As a result, the noise malfunction resistance is the same as that is the case where the resistance value $R_{g7}$ is equal to 500Ω, the switching speed at a turn-OFF time is the same as that in the case where the resistance value $R_{g7}$ is equal to 150Ω, and the noise output during the collector clamp is the same as that in the case where the resistance value $R_{g7}$ is equal to 500Ω. That is, even in the case where a gate resistor having the same resistance value as that in the background art is used, the switching speed according to the embodiment can be made higher than that in the background art.

As described above, even when noise which can turn OFF the IGBT 23 enters the G terminal in the semiconductor device according to the invention, there is no fear that the IGBT 23 may be turned OFF suddenly as in the configuration described in JP-A-2009-284420 or JP-A-2003-324966. When the resistance value $R_g$ of the gate resistor 21 is, for example, set at 500Ω as described above, the influence of such noise can be suppressed as long as the aforementioned period of time (t3–t2) is secured to some degree. Incidentally, the resistance value $R_g$ for securing the period of time (t3–t2) is not limited to the aforementioned 500Ω, but may be determined suitably in consideration of the duration of the noise, the gate capacitance of the IGBT 23, the value of the H-level voltage of the signal VG inputted to the G terminal, etc.

In addition, when the IGBT 23 actually begins to turn OFF, electric charges in the gate capacitance of the IGBT 23 can be extracted by the MOS transistor 243 to thereby increase the turn-OFF speed of the IGBT 23. Further, when the MOS transistor 243 is operated in the saturation region of the current on this occasion, noise during the collector clamp can be reduced in the same manner as when the MOS transistor 243 is not provided.

Embodiment 2

Figure 5:
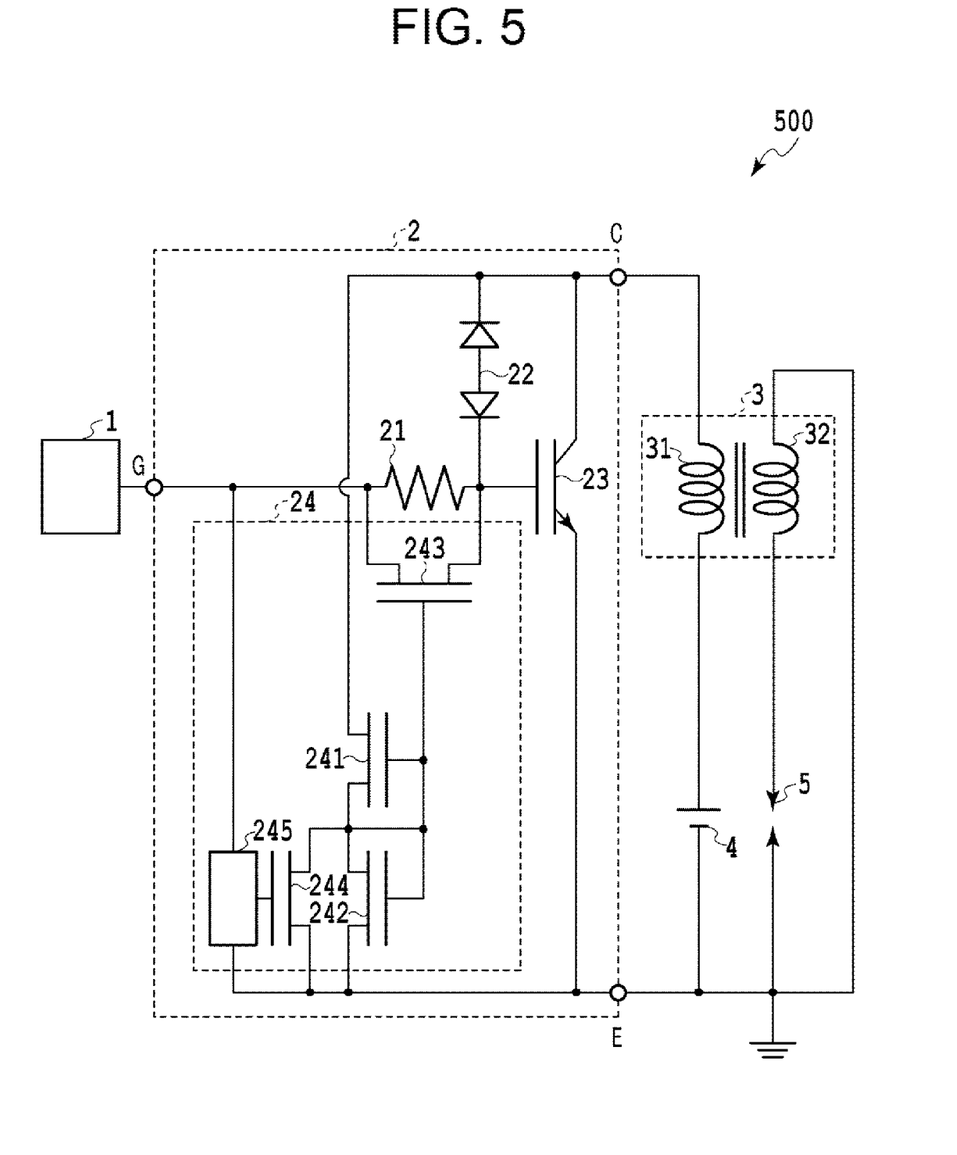
FIG. 5 is a view showing a configuration of a semiconductor device according to Embodiment 2 of the invention.

FIG. 5 shows a configuration of a semiconductor device according to Embodiment 2 of the invention. As shown in FIG. 5, a semiconductor device 500 according to Embodiment 2 is the same as the semiconductor device 100 according to Embodiment 1 shown in FIG. 1 except that the connection position of the source terminal of the MOS transistor 243 is changed from the E terminal to the G terminal. Operation of the semiconductor device 500 according to Embodiment 2 is the same as the semiconductor device 100 according to Embodiment 1.

In the semiconductor device 500 according to Embodiment 2, when the signal VG is an ON signal of an H-level, a source voltage of the MOS transistor 243 is set to be higher than the gate voltage of the MOS transistor 243 so as to limit the electrically conducting condition of the MOS transistor 243 only to when the signal VG is an OFF signal or immediately after the signal VG is changed over from an OFF signal to an ON signal.

Embodiment 3

Figure 6A:
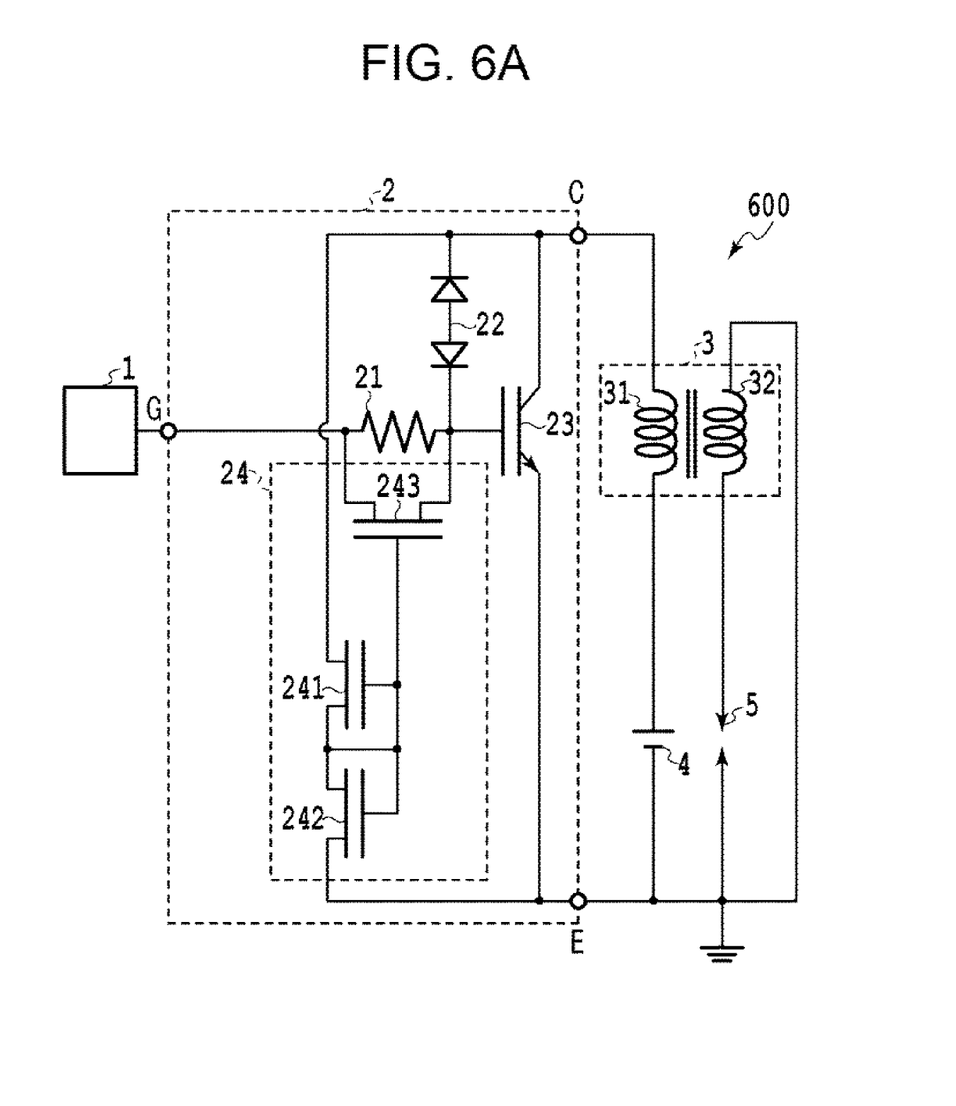
FIGS. 6A and 6B are views showing configurations of semiconductor devices according to Embodiment 3 of the invention.

FIG. 6A shows a configuration of a semiconductor device according to Embodiment 3 of the invention. As shown in FIG. 6A, the semiconductor device 600 according to Embodiment 3 is the same as the semiconductor device 500 according to Embodiment 2 shown in FIG. 5 except that the MOS transistor 244 and the threshold circuit 245 have been removed.

In the semiconductor device 600 according to Embodiment 3, when the signal VG is an ON signal of an H level, the source voltage of the MOS transistor 243 is set to be higher than the gate voltage of the MOS transistor 243 so as to limit the electrically conducting condition of the MOS transistor 243 only to when the signal VG is an OFF signal or immediately after the signal VG is changed over from an OFF signal to an ON signal, in the same manner as in the semiconductor device 500 according to Embodiment 2.

Specifically, when the threshold voltage $V_{th}$ of the MOS transistor 243 is 1 V, it is necessary to set the gate voltage of the MOS transistor 243 at about 3 V in order to establish the relation Vp=2V to thereby establish the same condition as that in the semiconductor device 100 according to Embodiment 1. When the signal VG is an ON signal (for example, 5 V), the MOS transistor 243 is blocked because the source voltage of the MOS transistor 243 is higher than the gate voltage of the MOS transistor 243. When the signal VG is an OFF signal of an L level (for example, 0 V), the MOS transistor 243 is in the same voltage state as in the case where the source terminal of the MOS transistor 243 is connected to the E terminal. Accordingly, even without the MOS transistor 244 and the threshold circuit 245, the MOS transistor 243 can make ON/OFF-operation equivalent to that in the semiconductor device according to Embodiment 1 or 2. The other operation according to Embodiment 3 is the same as the operation in Embodiment 1 or 2.

Figure 6B:
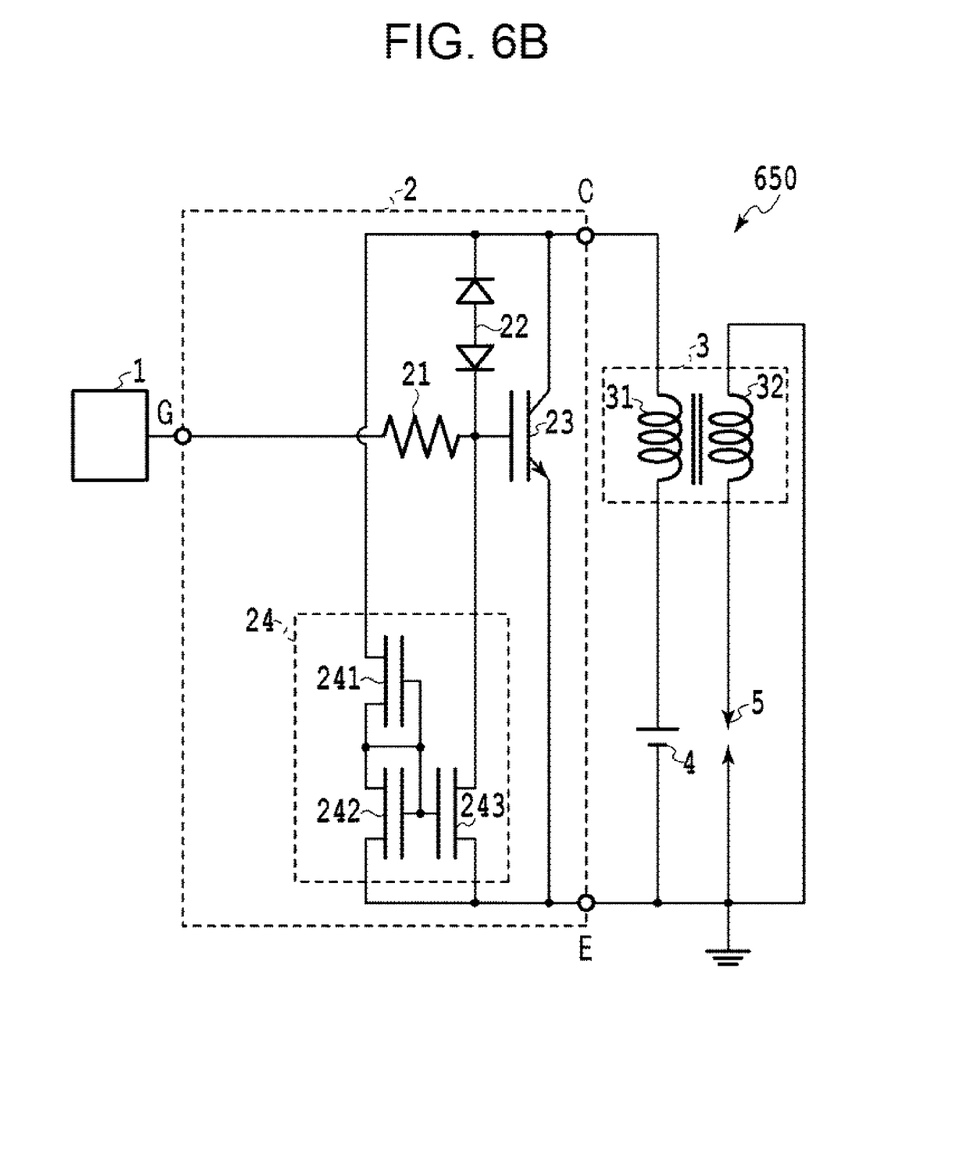

Although the semiconductor device according to Embodiment 3 has the configuration in which the source terminal of the MOS terminal 243 is connected to the G terminal, the semiconductor device may have a configuration in which the source terminal of the MOS transistor 243 is connected to the E terminal as in another configuration of a semiconductor device according to Embodiment 3 of the invention shown in FIG. 6B.

In the case of the semiconductor device 650 shown in FIG. 6B, when a signal inputted to the G terminal is an H level, the IGBT 23 turns ON and the voltage of the C terminal becomes zero. Accordingly, no current flows into the MOS transistors 241 and 242. As a result, no current flows into the MOS transistor 243 forming a current minor with respect to the MOS transistors 241 and 242. Accordingly, the IGBT 23 is released from pull-down performed by the MOS transistor 243. However, in this case, it is necessary to adjust various parameters so that the current supplied to the gate of the IGBT 23 from the input terminal G through the gate resistor 21 can be larger than the current extracted by the MOS transistor 243. For example, in the semiconductor device 650 shown in FIG. 6B, the current supplied from the G terminal is 10 mA when the H level of the G terminal is 5 V in terms of the numerical examples shown in Embodiment 1. On the other hand, since the current extracted by the MOS transistor 243 is 16 mA, the IGBT 23 cannot be turned ON as it is. Accordingly, when the source terminal of the MOS transistor 243 is connected to the E terminal, it is necessary to adjust a circuit constant so that the current supplied from the G terminal can be larger than the current extracted by the MOS transistor 243.

Incidentally, the semiconductor device according to any of Embodiments 1 to 3 may have a configuration in which the IGBT 23 is replaced by a power MOS transistor or a bipolar transistor.

What is claimed is:

1. A semiconductor device, comprising:
   a power semiconductor element;
   a gate pull-down circuit which is connected to a gate terminal of the power semiconductor element; and
   a gate resistor which is connected between an input terminal of the semiconductor device and the gate terminal of the power semiconductor element,
   wherein the gate pull-down circuit includes a constant current circuit by which electric charges can be extracted from a gate capacitance of the power semiconductor element when a signal inputted to the input terminal is at a low level.

2. A semiconductor device according to claim 1, wherein the gate pull-down circuit includes:
   a depletion type MOS transistor which has one end connected to a collector terminal of the semiconductor device;
   a first MOS transistor which has one end connected to the other end of the depletion type MOS transistor, and the other end connected to an emitter terminal of the semiconductor device; and
   a second MOS transistor which has a gate terminal connected in common to a gate terminal of the depletion type MOS transistor, a gate terminal of the first MOS transistor, the other end of the depletion type MOS transistor and the one end of the first MOS transistor, the second MOS transistor additionally having one end connected to the input terminal, and the other end connected to the gate terminal of the power semiconductor element.

3. A semiconductor device according to claim 1, wherein the gate pull-down circuit includes:
   a depletion type MOS transistor which has one end connected to a collector terminal of the semiconductor device;
   a first MOS transistor which has one end connected to the other end of the depletion type MOS transistor, and the other end connected to an emitter terminal of the semiconductor device; and
   a second MOS transistor which has a gate terminal connected in common to a gate terminal of the depletion type MOS transistor, a gate terminal of the first MOS transistor, the other end of the depletion type MOS transistor and the one end of the first MOS transistor, the second MOS transistor additionally having one end connected to an emitter terminal of the semiconductor device, and the other end connected to the gate terminal of the power semiconductor element.

4. A semiconductor device according to claim 1, wherein the constant current source comprises first and second transistors, each of the first and second transistors having a control terminal and a pair of controlled terminals, conduction between the controlled terminals of each transistor being determined by signals received by the control terminal thereof, and wherein the control terminals of the first and second transistors are connected to one another.

5. A semiconductor device according to claim 1, wherein the constant current source comprises a transistor having a control terminal and a pair of controlled terminals, conduction between the controlled terminals being determined by signals received by the control terminal, and wherein one of the controlled terminals is connected to a first end of the gate resistor and the other of the controlled terminals is connected to a second end of the gate resistor.

6. A semiconductor device according to claim 1, wherein the gate pull-down circuit includes:
   a depletion type MOS transistor which has one end connected to a collector terminal of the semiconductor device;
   a first MOS transistor which has one end connected to the other end of the depletion type MOS transistor, and the other end connected to an emitter terminal of the semiconductor device;
   a second MOS transistor which has a gate terminal connected in common to a gate terminal of the depletion type MOS transistor, a gate terminal of the first MOS transistor, the other end of the depletion type MOS transistor, and the one end of the first MOS transistor, the second MOS transistor additionally having one end connected to the gate terminal of the power semiconductor element, and the other end connected to an emitter terminal of the semiconductor device or the input terminal;
   a threshold circuit which is connected between the input terminal and the emitter terminal of the semiconductor device; and
   a third MOS transistor which has a gate terminal connected to an output terminal of the threshold circuit, one end connected to the gate terminal of the second MOS transistor, and the other end connected to the emitter terminal of the semiconductor device.

7. A semiconductor device according to claim 6, wherein:
   the threshold circuit outputs the same voltage as the signal inputted to the input terminal when the signal inputted to the input terminal is larger than a threshold value, and the threshold circuit outputs 0 V when the signal inputted to the input terminal is smaller than the threshold value.

8. A semiconductor device according to claim 6, wherein the threshold circuit includes:
   a voltage dividing circuit which is connected between the input terminal and the emitter terminal of the semiconductor device;
   a second depletion type MOS transistor and a fourth MOS transistor which are connected in series between the input terminal and the emitter terminal of the semiconductor device; and
   a third depletion type MOS transistor and a fifth MOS transistor which are connected in series between the input terminal and the emitter terminal of the semiconductor device,
   wherein an output terminal of the voltage dividing circuit is connected to a gate terminal of the fourth MOS transistor,
   wherein a gate terminal of the fifth MOS transistor is connected to a gate terminal and a source terminal of the second depletion type MOS transistor and to a drain terminal of the fourth MOS transistor, and
   wherein a gate terminal of the third depletion type MOS transistor is connected to a source terminal of the third depletion type MOS transistor, a drain terminal of the fifth MOS transistor, and the output terminal of the threshold circuit.

9. A semiconductor device according to claim 1, further comprising:
   a Zener diode which is connected between the gate terminal of the power semiconductor element and a collector terminal of the semiconductor device.

10. A semiconductor device according to claim 9, wherein the gate pull-down circuit includes:
    a depletion type MOS transistor which has one end connected to a collector terminal of the semiconductor device;

a first MOS transistor which has one end connected to the other end of the depletion type MOS transistor, and the other end connected to an emitter terminal of the semiconductor device; and a second MOS transistor which has a gate terminal connected in common to a gate terminal of the depletion type MOS transistor, a gate terminal of the first MOS transistor, the other end of the depletion type MOS transistor and the one end of the first MOS transistor, the second MOS transistor additionally having one end connected to the input terminal, and the other end connected to the gate terminal of the power semiconductor element.

11. A semiconductor device according to claim 9, wherein the gate pull-down circuit includes:

a depletion type MOS transistor which has one end connected to a collector terminal of the semiconductor device;

a first MOS transistor which has one end connected to the other end of the depletion type MOS transistor, and the other end connected to an emitter terminal of the semiconductor device; and a second MOS transistor which has a gate terminal connected in common to a gate terminal of the depletion type MOS transistor, a gate terminal of the first MOS transistor, the other end of the depletion type MOS transistor and the one end of the first MOS transistor, the second MOS transistor additionally having one end connected to an emitter terminal of the semiconductor device, and the other end connected to the gate terminal of the power semiconductor element.

12. A semiconductor device according to claim 9, wherein the gate pull-down circuit includes:

a depletion type MOS transistor which has one end connected to a collector terminal of the semiconductor device;

a first MOS transistor which has one end connected to the other end of the depletion type MOS transistor, and the other end connected to an emitter terminal of the semiconductor device;

a second MOS transistor which has a gate terminal connected in common to a gate terminal of the depletion type MOS transistor, a gate terminal of the first MOS transistor, the other end of the depletion type MOS transistor, and the one end of the first MOS transistor, the second MOS transistor additionally having one end connected to the gate terminal of the power semiconductor element, and the other end connected to an emitter terminal of the semiconductor device or the input terminal;

a threshold circuit which is connected between the input terminal and the emitter terminal of the semiconductor device; and a third MOS transistor which has a gate terminal connected to an output terminal of the threshold circuit, one end connected to the gate terminal of the second MOS transistor, and the other end connected to the emitter terminal of the semiconductor device.

13. A semiconductor device according to claim 12, wherein:

the threshold circuit outputs the same voltage as the signal inputted to the input terminal when the signal inputted to the input terminal is larger than a threshold value, and the threshold circuit outputs 0 V when the signal inputted to the input terminal is smaller than the threshold value.

14. A semiconductor device according to claim 12, wherein the threshold circuit includes:

a voltage dividing circuit which is connected between the input terminal and the emitter terminal of the semiconductor device;

a second depletion type MOS transistor and a fourth MOS transistor which are connected in series between the input terminal and the emitter terminal of the semiconductor device; and a third depletion type MOS transistor and a fifth MOS transistor which are connected in series between the input terminal and the emitter terminal of the semiconductor device, wherein an output terminal of the voltage dividing circuit is connected to a gate terminal of the fourth MOS transistor, wherein a gate terminal of the fifth MOS transistor is connected to a gate terminal and a source terminal of the second depletion type MOS transistor and to a drain terminal of the fourth MOS transistor, and wherein a gate terminal of the third depletion type MOS transistor is connected to a source terminal of the third depletion type MOS transistor, a drain terminal of the fifth MOS transistor, and the output terminal of the threshold circuit.

15. A semiconductor device, comprising:

a power semiconductor element;

a gate resistor which is connected between an input terminal of the semiconductor device and a gate terminal of the power semiconductor element, and a gate pull-down circuit which is connected to the gate terminal of the power semiconductor element, the gate pull-down circuit including extraction means for extracting electric charges from the gate terminal of the power semiconductor element due to gate capacitance of the power semiconductor element when a signal inputted to the input terminal is at a low level.

16. A semiconductor device according to claim 15, wherein the extraction means comprises a constant current circuit.

17. A semiconductor device according to claim 15, in combination with an ignition coil having a primary winding that is connected to a further terminal of the power semiconductor element.

18. A semiconductor device according to claim 15, wherein the extraction means comprises first and second transistors, each of the first and second transistors having a control terminal and a pair of controlled terminals, conduction between the controlled terminals of each transistor being determined by signals received by the control terminal thereof, and wherein the control terminals of the first and second transistors are connected to one another.

19. A semiconductor device according to claim 15, wherein the extraction means comprises a transistor having a control terminal and a pair of controlled terminals, conduction between the controlled terminals being determined by signals received by the control terminal, and wherein the control terminals of the first and second transistors are connected to one another, and wherein one of the controlled terminals is connected to a first end of the gate resistor and the other of the controlled terminals is connected to a second end of the gate resistor.

* * * * *